United States Patent [19]
Myers et al.

[11] Patent Number: 5,942,938
[45] Date of Patent: Aug. 24, 1999

[54] METHOD AND APPARATUS FOR HIGH EFFICIENCY POWER AMPLIFICATION

[75] Inventors: Ronald Gene Myers, Scottsdale; Bernard Eugene Sigmon; Robert Michael Jackson, both of Gilbert, all of Ariz.

[73] Assignee: Motorola, Inc., Schaumburg, Ill.

[21] Appl. No.: 08/998,749

[22] Filed: Dec. 29, 1997

[51] Int. Cl.⁶ .................................................. H03F 3/38
[52] U.S. Cl. ...................................... 330/10; 330/207 A
[58] Field of Search ................................ 330/10, 207 A, 330/251, 124, 136, 149, 124 R

[56] References Cited

U.S. PATENT DOCUMENTS

| | | | |
|---|---|---|---|
| 3,777,275 | 12/1973 | Cox | 330/10 |
| 4,831,334 | 5/1989 | Hudspeth et al. | 330/10 |
| 5,251,330 | 10/1993 | Chiba et al. | 455/91 |
| 5,831,475 | 11/1998 | Myers et al. | 330/10 |
| 5,847,602 | 12/1998 | Su | 330/10 |
| 5,861,777 | 1/1999 | Sigmon et al. | 330/136 |

*Primary Examiner*—Robert Pascal
*Assistant Examiner*—Henry Choe
*Attorney, Agent, or Firm*—Dana B. LeMoine

[57] ABSTRACT

A method and apparatus for efficient power amplification of a modulated signal includes an envelope detector (220), an multi-output class S modulator (270), a driver amplifier (250), and a power amplifier (260). The multi-output class S modulator (270) amplifies the envelope of the input signal and generates a primary amplified envelope signal and at least one offset amplified envelope signal. The offset amplified envelope signal is used to modulate the driver amplifier (250), and the primary amplified envelope signal is used to modulate the power amplifier (260).

15 Claims, 5 Drawing Sheets

METHOD AND APPARATUS FOR HIGH EFFICIENCY POWER AMPLIFICATION

FIELD OF THE INVENTION

This invention relates in general to power amplifiers and, in particular, to high efficiency, wideband power amplifiers.

BACKGROUND OF THE INVENTION

Various apparatus are available for amplifying signals. In amplifier applications that involve the amplification and transmission of modulated signals, a premium is placed on amplifier efficiency. In addition, because many modulated signals include information in the amplitude envelope and the phase of the signal, a premium is placed on the ability to create a high fidelity reproduction of the signal. In particular, the amplifier preferably exhibits very low amplitude distortion and very low phase distortion.

Communications devices, which often transmit signals having information in both amplitude and phase, are an example application where these qualities are in demand. Low distortion allows the communications devices to communicate more reliably and high efficiency allows the devices to operate longer on a single battery.

One method of achieving increased efficiency is to use saturating amplifiers. Saturating amplifiers, such as class C amplifiers, achieve the goal of high efficiency at the expense of nonlinearity. Nonlinear amplifiers, however, cannot be used in applications where information is included in the amplitude envelope because that information is corrupted by the nonlinear amplification. When amplitude information has been corrupted by a nonlinear amplifier, amplitude distortion has occurred.

Further, when power amplifiers are driven with high level input signals, a nonlinear phase response results. However, once again, amplifiers with nonlinear phase response cannot be used in applications where information is included in the phase, because that information is corrupted by the nonlinear phase response, resulting in phase distortion and loss of information.

In addition to distortion and loss of information, nonlinear operation of saturated amplifiers causes an increase in intermodulation products. Intermodulation products cause undesirable amounts of energy to be present in frequency bands other than the one intended for use. This undesirable energy is commonly quantified and termed Adjacent Channel Power (ACP). Excessively high levels of ACP can cause an amplifier to be unsuitable for a particular application.

Since efficiency has traditionally been gained by driving amplifiers into saturation, and since driving amplifiers into saturation causes intermodulation products to rise, high efficiency and low intermodulation products have historically been traded off against each other. It would be very desirable to achieve low intermodulation products in a highly efficient saturating amplifier, thereby obviating the need for a trade-off between the two.

Accordingly, there is a need for a high efficiency saturating amplifier with a linear amplitude response and resulting low amplitude distortion. There is also a significant need for a high efficiency linear power amplifier with reduced phase distortion. There is also a need for a high efficiency saturating amplifier that exhibits low intermodulation products.

DETAILED DESCRIPTION OF THE DRAWINGS

Generally, the present invention helps solve the above-identified problems by providing an apparatus and method for reducing distortion in high efficiency linear power amplifiers.

Figure 1:
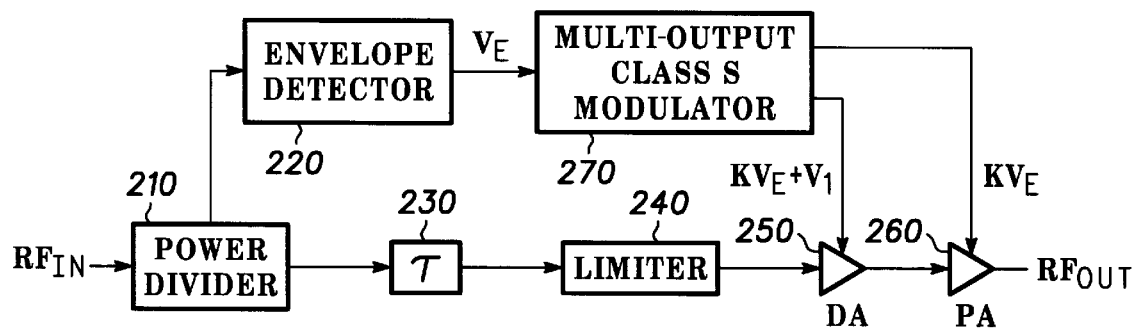
FIG. 1 shows a diagram of an amplifier in accordance with a preferred embodiment of the present invention.

FIG. 1 shows a diagram of an amplifier in accordance with a preferred embodiment of the present invention.

Envelope Elimination and Restoration (EER) is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S or other highly efficient power amplifier which operates on the bandwidth of the RF envelope rather than the RF bandwidth. The phase modulated carrier in the phase path is then amplitude modulated by the amplified envelope signal, creating an amplified replica of the input signal.

EER-type amplifier 10 includes power divider 210, envelope detector 220, multi-output class S modulator 270, time delay element 230, limiter 240, driver amplifier 250, and power amplifier 260. EER-type amplifier 10 receives an RF input into power divider 210. Power divider 210 splits the RF input signal into an amplitude path which feeds envelope detector 220, and a phase path which feeds time delay element 230.

The phase path of EER-type amplifier 10 includes time delay element 230, limiter 240, driver amplifier 250, and power amplifier 260. Time delay element 230, which produces a delay equal to that introduced by multi-output class S modulator 270 in the amplitude path, receives an output from power divider 210. Limiter 240 receives the time delayed signal output from time delay element 230, and amplitude limits the signal. Limiter 240 can be omitted, or it can perform soft limiting, but limiter 240 preferably performs hard limiting so that the output of limiter 240 includes phase information with little or no amplitude information. After limiting, with the amplitude information removed, the resultant signal is the phase modulated carrier. The phase modulated carrier output from limiter 240 is then input to driver amplifier 250 which, in turn, drives power amplifier 260. Driver amplifier 250 and power amplifier 260 are amplifier stages capable of being modulated, and are preferably field effect transistor (FET) amplifiers. The drains of the FET amplifiers are conventionally connected to a DC power source; however, as will be discussed below, in a preferred embodiment exemplified herein, the drains of the FET amplifiers are driven with signals, resulting in an amplitude modulated output signal.

In a preferred embodiment, time delay element 230 is used in the phase path because it is desirable to recombine the signals from the amplitude path and the phase path after each has been subjected to substantially equal delays. The absolute delay of time delay element 230 is such that the total delay in the phase path is substantially equal to the total delay in the amplitude path. Time delay element 230 is shown as the first element in the phase path; however, the actual placement of time delay element 230 within the phase path is not a limitation of the present invention. Because the function of time delay element 230 is to balance the delays in the phase path and the amplitude path, the actual position of time delay element 230 in the phase path is not important.

Alternate embodiments of the present invention substantially match the delay in the two paths using circuit arrangements other than the one using time delay element 230 alone. In a first alternate embodiment, multiple delay lines, one in each of the phase path and amplitude path are used. In this case, the absolute delay of any one delay line assumes less importance, and the differential delay between the two delay lines is used to match the delays in the two paths. In another alternate embodiment, a differential delay line, such as a surface acoustic wave (SAW) delay line, with one input and multiple outputs is used as a combination of power divider 210 and time delay element 230. In this alternate embodiment, as in the first alternate embodiment, the differential delay is used to match the delay in the two paths.

The amplitude path of EER-type amplifier 10 includes envelope detector 220 and multi-output class S modulator 270. Envelope detector 220 detects the envelope of the RF input signal and outputs an envelope signal which represents the amplitude information included in the original RF input signal. Envelope detector 220 is preferably a diode detector; however, other types of detectors, such as a synchronous detector based upon a double balanced mixer, could be used.

Multi-output class S modulator 270 amplifies the envelope signal ($V_E$) output from envelope detector 220 and drives the drain bias of power amplifier 260 with the amplified envelope signal ($KV_E$). Multi-output class S modulator 270 amplifies the envelope signal to a level commensurate with the desired output. The output of multi-output class S modulator 270 is the power supply for power amplifier 260, and the resultant remodulation of the phase modulated carrier restores the envelope, producing an amplified replica of the input signal. Multi-output class S modulator 270 also outputs an offset amplified version of $V_E$. This signal, ($KV_E+V_1$), is used to modulate the driver amplifier.

In the EER-type amplifier of FIG. 1 it is desirable to reduce phase distortion as much as possible, and in particular, it is desirable to reduce any phase distortion introduced by power amplifier 260. The present invention provides such a strategy for reducing the phase distortion in the power amplifier 260.

In EER-type amplifiers, efficiency is gained by operating the final power amplifier at or near saturation. When operating at or near saturation, the amplifier is operating at a region of compression, where as drive levels change, the phase of the output also changes. In conventional EER-type amplifiers, the input level to the final power amplifier is substantially constant while the amplifier is modulated by the envelope signal. Even though the amplifier is constantly at or near saturation, the compression point is changing as the drain bias is changed. A preferred embodiment of the present invention provides a strategy for reducing phase errors in power amplifier 260 which are a function of, among other things, changes in the compression point. In a preferred embodiment as exemplified in FIG. 1, power amplifier 260 is operated at a substantially constant compression point thus reducing phase error contributions from the final power amplifier.

By driving power amplifier 260 with driver amplifier 250, and by modulating driver amplifier 250 as a function of the amplified envelope, the relationship between the input to power amplifier 260 and the drain bias of power amplifier 260 are maintained such that power amplifier 260 is operated at a substantially constant compression point. The modulating signal for driver amplifier 250, $KV_E+V_1$, causes the output of driver amplifier 250 to be distorted in response to the envelope of the original input signal. In a preferred embodiment, the distortion in driver amplifier 250 as a result of the modulating signal reduces the remaining distortion present in the driver amplifier chain.

Figure 2:
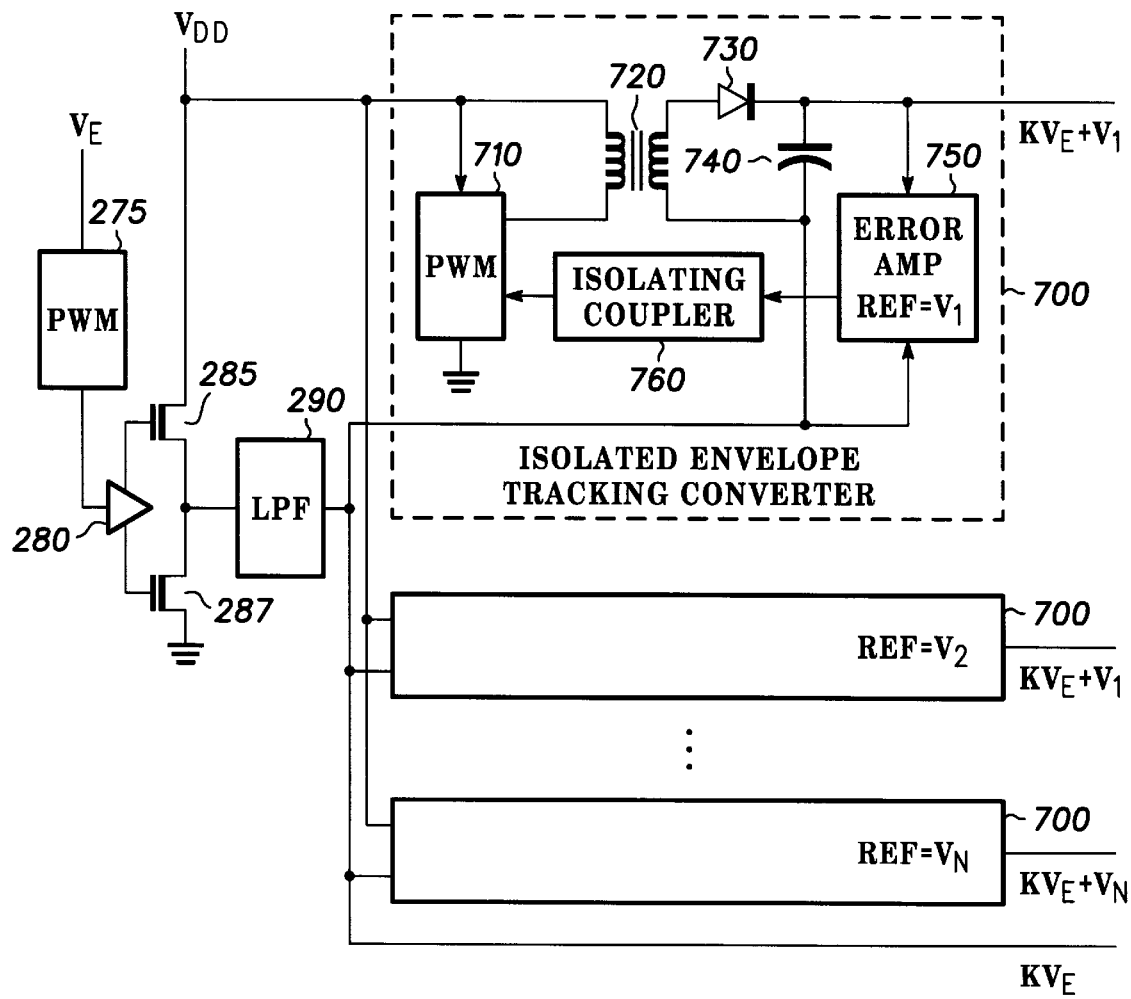
FIG. 2 shows a diagram of a multi-output class S modulator in accordance with a preferred embodiment of the present invention.

FIG. 2 shows a diagram of a multi-output class S modulator in accordance with a preferred embodiment of the present invention. Multi-output class S modulator 270 includes pulsewidth modulator 275, driver 280, switching transistors 285 and 287, low pass filter 290, and at least one isolated envelope tracking converter 700.

Pulsewidth modulator (PWM) 275 is a "primary" pulsewidth modulator because it receives the envelope signal ($V_E$) from envelope detector 220 (FIG. 1). PWM 275 outputs a pulsewidth modulated signal which has a duty cycle substantially proportional to the amplitude of the envelope signal. Driver 280 accepts the pulsewidth modulated signal from PWM 275, and drives switching transistors 285 and 287 which alternately turn on as a function of the duty cycle of the pulsewidth modulated signal.

When the pulsewidth modulated signal is high, switching transistor 285 is on, thereby presenting a voltage substantially equal to Vdd at low pass filter 290. Conversely, when the pulsewidth modulated signal is low, switching transistor 285 is off and switching transistor 287 is on. This discharges the node at the input to low pass filter 290, thereby bringing it close to ground potential. Low pass filter 290 filters the resulting amplified pulsewidth modulated signal, suppressing the switching frequency of PWM 270, and producing an amplified replica of the envelope signal. The amplified replica of the envelope signal is shown in FIG. 2 as $KV_E$, where K represents the gain of the amplifier. The $KV_E$ output of multi-output class S modulator 270 is used to modulate the final power amplifier shown as amplifier 260 (FIG. 1). $KV_E$ is the primary amplified envelope signal because it is generated by primary PWM 270, and because it modulates the highest power amplifier in the phase path.

Multi-output modulator 270 also outputs offset versions of $KV_E$. They are shown in FIG. 1 as $KV_E+V_1$, $KV_E+V_2$, and $KV_E+V_N$. Although the embodiment of multi-output amplifier 270 shown in FIG. 1 only uses two outputs ($KV_E$ and $KV_E+V_1$), one skilled in the art will appreciate that any number of additional outputs could be generated using the method and apparatus of the present invention. Each offset output is generated by an isolated envelope tracking converter (IETC) 700. IETC 700 includes "secondary" PWM 710, power transformer 720, rectifier 730, filter 740, error amplifier 750, and isolating coupler 760.

In operation, error amplifier 750 is referenced to the output of low pass filter 290, $KV_E$. In a preferred embodiment, error amplifier 750 is an operational amplifier with a "ground" of $KV_E$. The inputs of error amplifier 750 are the offset output, $KV_E+V_1$, and a reference voltage which is set to the desired offset, $V_1$. When the desired offset is $V_1$, the reference voltage can be set to a value other than $V_1$ and power transformer 720 can step up or down an amount necessary to effect an offset equal to $V_1$. The circuit is arranged such that the output of error amplifier 750 is an error term that will force the offset output, $KV_E+V_1$, to be substantially equal to the low pass filter output, $KV_E$, plus the desired offset voltage of $V_1$. For IETC 700 to create outputs with different offset values, the reference voltage is changed. FIG. 2 shows two additional IETCs 700, one with the reference set to V2, and one with the reference set to $V_N$, for producing the outputs $KV_E+V_1$ and $KV_E+V_N$, respectively.

The output of error amplifier 750 is input to PWM 710 after going through isolating coupler 760. The use of isolating coupler 760 to isolate error amplifier 750 from PWM 710 allows error amplifier 750 to be referenced to $KV_E$ and PWM 710 to be referenced to a system ground. Isolating coupler 760 can be one of many different types of coupling circuits including a magnetic coupler or an optical coupler.

PWM 710 receives the isolated error signal from isolating coupler 760 and generates a pulsewidth modulated signal. The pulsewidth modulated signal output from PWM 710 has a duty cycle substantially proportional to the isolated error signal. This duty cycle is substantially constant, corresponding to the desirably constant reference voltage with variations due, in part, to corrections generated by the feedback. Just as isolating coupler 760 isolates the input of PWM 710 from the offset output, power transformer 720 isolates the output of PWM 710 from the offset output. Power transformer 720 isolates and steps up or steps down the voltage of the pulsewidth modulated signal. Because power transformer 720 can step up or down the PWM output, the resulting output offset can be more or less than the offset voltage present at the reference input to error amplifier 750. This allows standard reference diodes and other circuits to be used while generating offsets with various values.

Rectifier 730 and filter 740 then rectify and filter the isolated pulsewidth modulated signal to superimpose $V_1$ on top of $KV_E$. Filter 740, shown as a capacitor in FIG. 2, filters the rectified pulsewidth modulated signal and also functions to couple the $KV_E$ output with the offset, thereby generating the desired output, $KV_E+V_1$.

Isolated envelope tracking converter 700 provides advantages over prior art methods of generating offset voltages. One well known prior art method is to use linear regulators. Linear regulators are dissipative and thus are inefficient. The embodiment of the present invention as shown in FIG. 2 is much more efficient in part because it uses a switching pulsewidth modulator. Switching circuits are much more efficient than linear, dissipative circuits.

Figure 3:
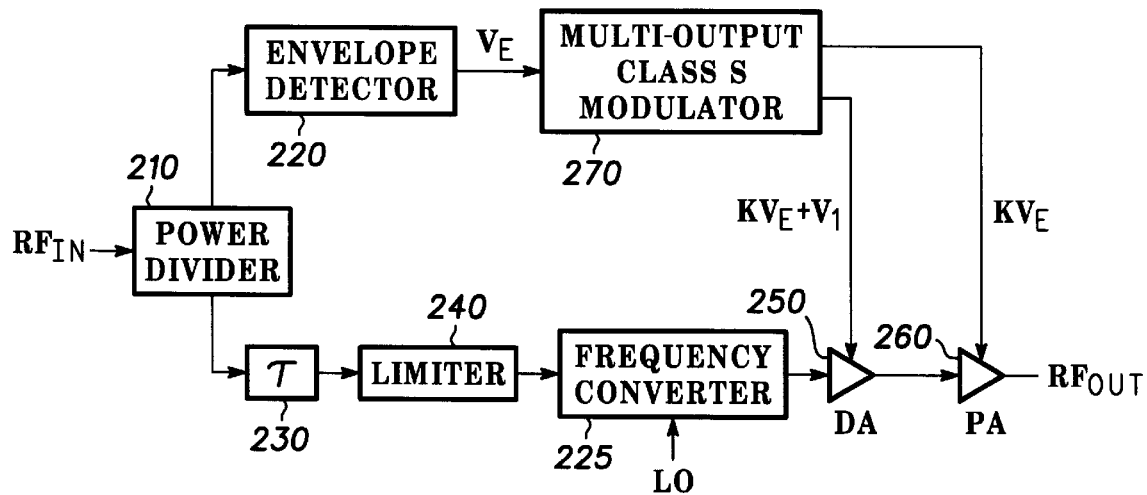
FIG. 3 shows an amplifier in accordance with an alternate embodiment of the present invention.

FIG. 3 shows an amplifier in accordance with an alternate embodiment of the present invention. In FIG. 3 an intermediate frequency (IF) signal is shown as the input signal to EER-type amplifier 20. The IF signal is input into power divider 210. Power divider 210 functions to split the input signal into the amplitude path and the phase path. The amplitude path feeds envelope detector 220, and the phase path feeds time delay element 230.

The amplitude path of EER-type amplifier 20 includes envelope detector 220 and multi-output class S modulator 270. These elements correspond to the elements of FIG. 1 which have like names and like reference numbers. In addition, multi-output class S modulator 270 corresponds to multi-output class S modulator 270 of FIG. 1, which was discussed in detail previously in connection with FIG. 2.

The phase path of EER-type amplifier 20 includes time delay element 230, limiter 240, frequency converter 245, driver amplifier 250, and power amplifier 260. Time delay element 230, limiter 240, driver amplifier 250, and power amplifier 260 correspond to the elements shown in FIG. 1 with like names and like reference numbers. In contrast to the embodiment shown in FIG. 1, the alternate embodiment of FIG. 3 includes frequency converter 245 in the phase path. Frequency converter 245 receives the signal in the phase path and also receives a local oscillator (LO) signal. Frequency converter 245 converts the frequency of the carrier signal to its final RF frequency using circuits well known in the art, such as a mixer. The resulting signal is then used to drive driver amplifier 250, which in turn, drives power amplifier 260 which operates at the final RF frequency.

Because of the operation of frequency converter 245, the amplifier of FIG. 3 takes in a signal at a frequency different from the final RF frequency. FIG. 3 shows an IF signal input to EER-type amplifier 20. The IF input signal can be above or below the resultant RF frequency. In addition, one skilled in the art will understand that a baseband signal could also be used. Therefore, in the alternate embodiment exemplified in FIG. 3, the input signal can be at any frequency different from the RF frequency.

In this circuit arrangement, with frequency converter 245 being an integral part of the amplifier, the amplifier becomes more tightly integrated with the device that houses the amplifier. Tighter integration results in smaller, lower power devices, which are easier to manufacture.

Figure 4:
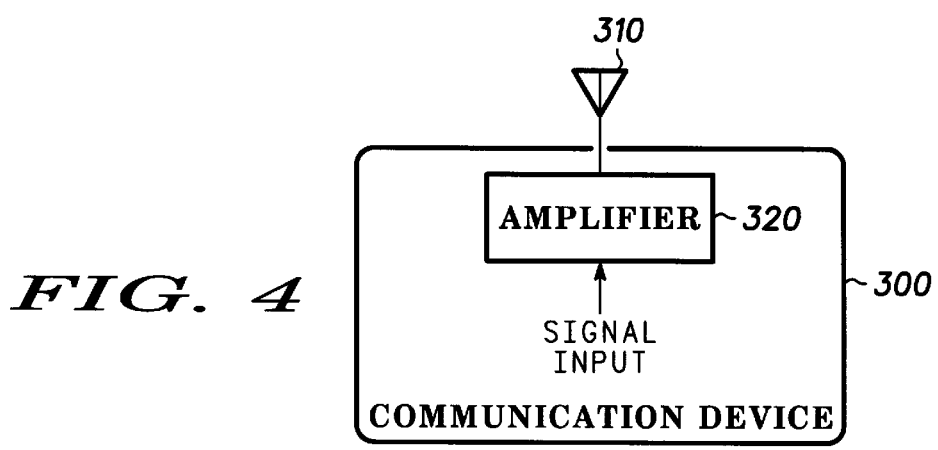
FIG. 4 shows a diagram of a communications device in accordance with a preferred embodiment of the present invention.

FIG. 4 shows a diagram of a communications device in accordance with a preferred embodiment of the present invention. Communications device 300 includes amplifier 320 and antenna 310. Amplifier 320 may comprise any of the amplifiers of the present invention, including for example, EER-type amplifier 10 (FIG. 1), multi-output class S modulator 270 (FIG. 2), or EER-type amplifier 20 (FIG. 3). Communications device 300 may be one of many different devices capable of communications. Examples include, but are not limited to, subscriber units in a communications system, radio receivers, transmitters, and transceivers, one-way and two-way pagers, and cellular phones.

Figure 5:
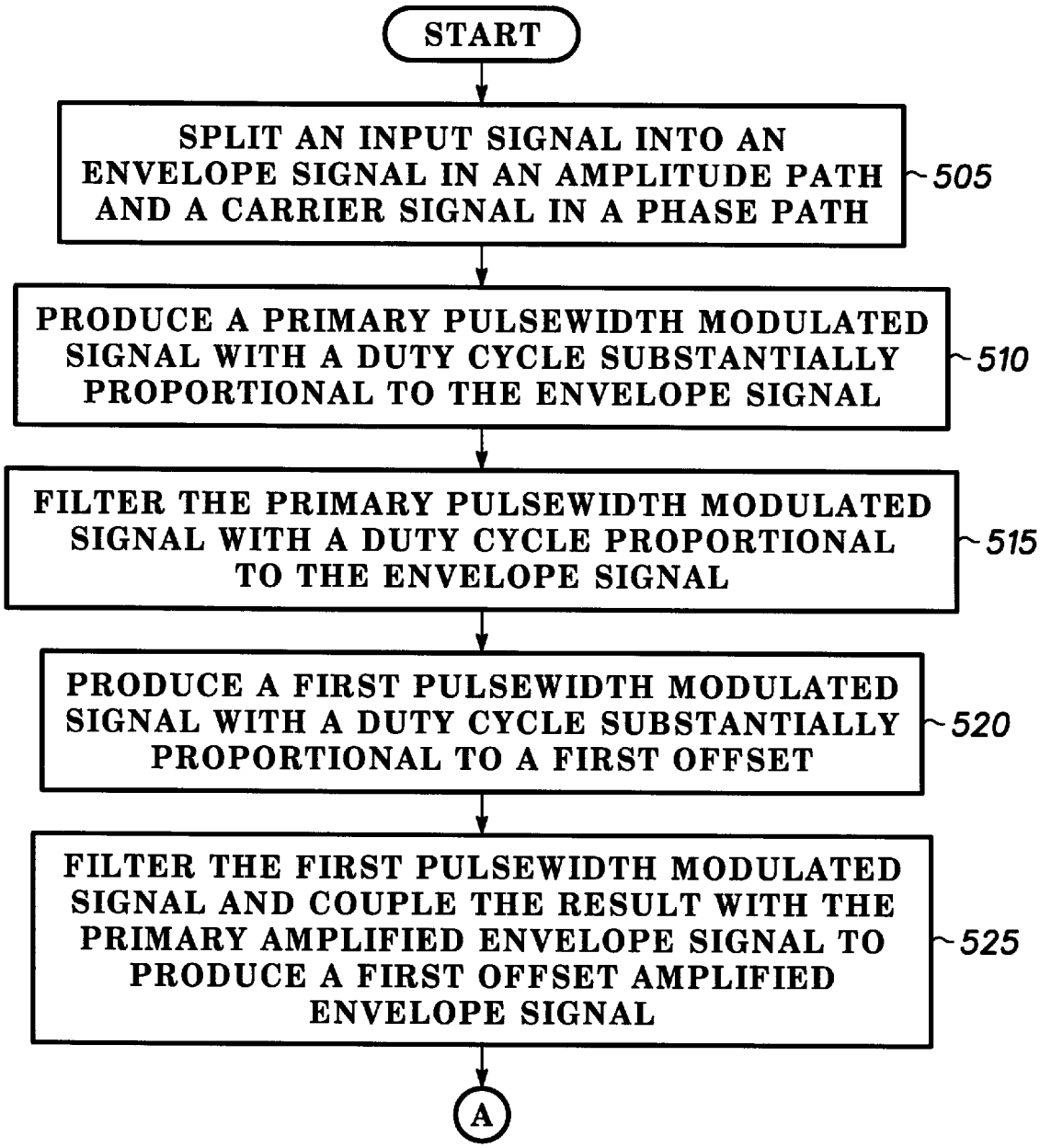
FIG. 5 shows a flow chart for a method of amplifying a signal in accordance with a preferred embodiment of the present invention.
Figure 6:
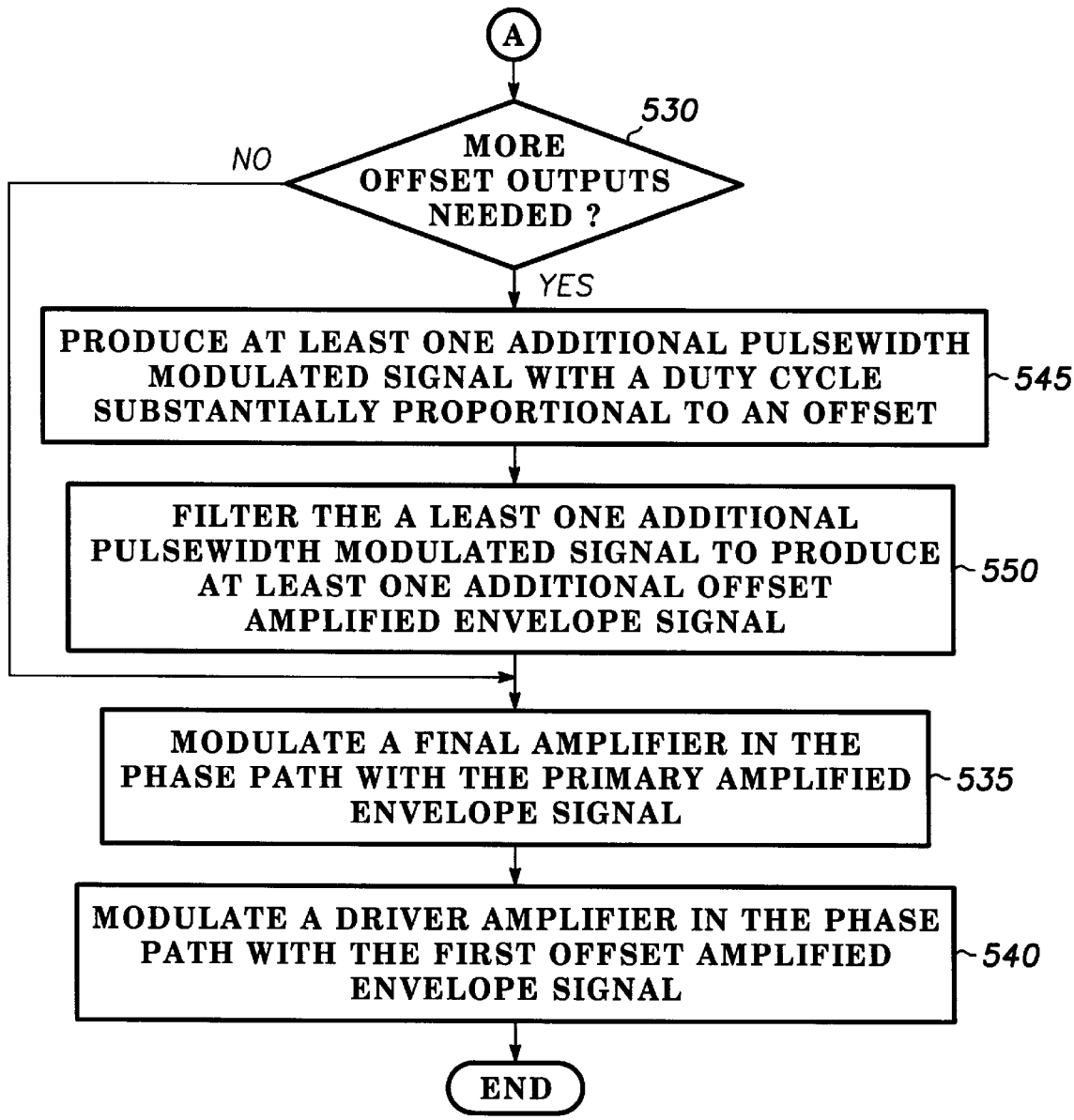
FIG. 6 shows a flow chart for a method of amplifying a signal in accordance with a preferred embodiment of the present invention.

FIGS. 5 and 6 show a flow chart for a method of amplifying a signal in accordance with a preferred embodiment of the present invention. In step 505 an input signal is split into an envelope signal in an amplitude path, and a carrier signal in a phase path. The signal is preferably split with a power divider where one output of the power divider feeds an envelope detector to create the envelope signal. Another output of the power splitter is fed to a limiter so that an amplitude limited phase modulated carrier exists in the phase path.

In step 510, a primary pulsewidth modulated signal is created. The primary pulsewidth modulated signal has a duty cycle proportional to the envelope signal. In step 515 the primary pulsewidth modulated signal is filtered to produce a primary amplified envelope signal. Then, in step 520, a first pulsewidth modulated signal (different from the primary pulsewidth modulated signal) is produced having a duty cycle substantially proportional to a first offset.

In step 525 the first pulsewidth modulated signal is filtered and coupled with the primary amplified envelope signal resulting in a first offset amplified envelope signal. At this point in the method, two signals have been generated as a result of pulsewidth modulation operations: the primary amplified envelope signal, and the first offset amplified envelope signal. The first offset amplified envelope signal has been generated very efficiently by generating a pulsewidth modulated signal with a substantially constant duty cycle, filtering, and coupling with the result with the primary amplified envelope signal. Any number of additional offset envelope signals can be generated in a like manner, as is explained below with reference to FIG. 6.

Method 500 of FIG. 5 continues with FIG. 6. In decision block 530 a determination is made whether or not additional offset outputs are needed. If so, processing branches to step 545. In step 545 at least one additional pulsewidth modulated signal is generated with a duty cycle substantially proportional to an offset. If multiple additional pulsewidth modulated signals are generated, each is substantially proportional to a different offset, as one purpose of this step is create additional outputs, each with a different offset. Then, in step 550, each of the additional pulsewidth modulated signals generated in step 545 is filtered and coupled to the primary amplified envelope signal, thereby creating additional offset amplified envelope signals.

After step 550, or if in step 530 no more outputs are needed, processing continues with step 535. In step 535 a final amplifier in the phase path is modulated with the primary amplified envelope signal. Then in step 540 a driver amplifier in the phase path is modulated with the first offset amplified envelope signal. The result of method 500 is an amplified replica of the original input signal. The amplified replica is a high fidelity replica of the input signal because, in part, the driver amplifier has been modulated with the offset amplified envelope signal. In addition, method 500 provides for efficient amplification because, in part, the first offset amplified envelope signal is generated with an efficient pulsewidth modulation technique. This technique is more fully explained with reference to FIG. 7.

Figure 7:
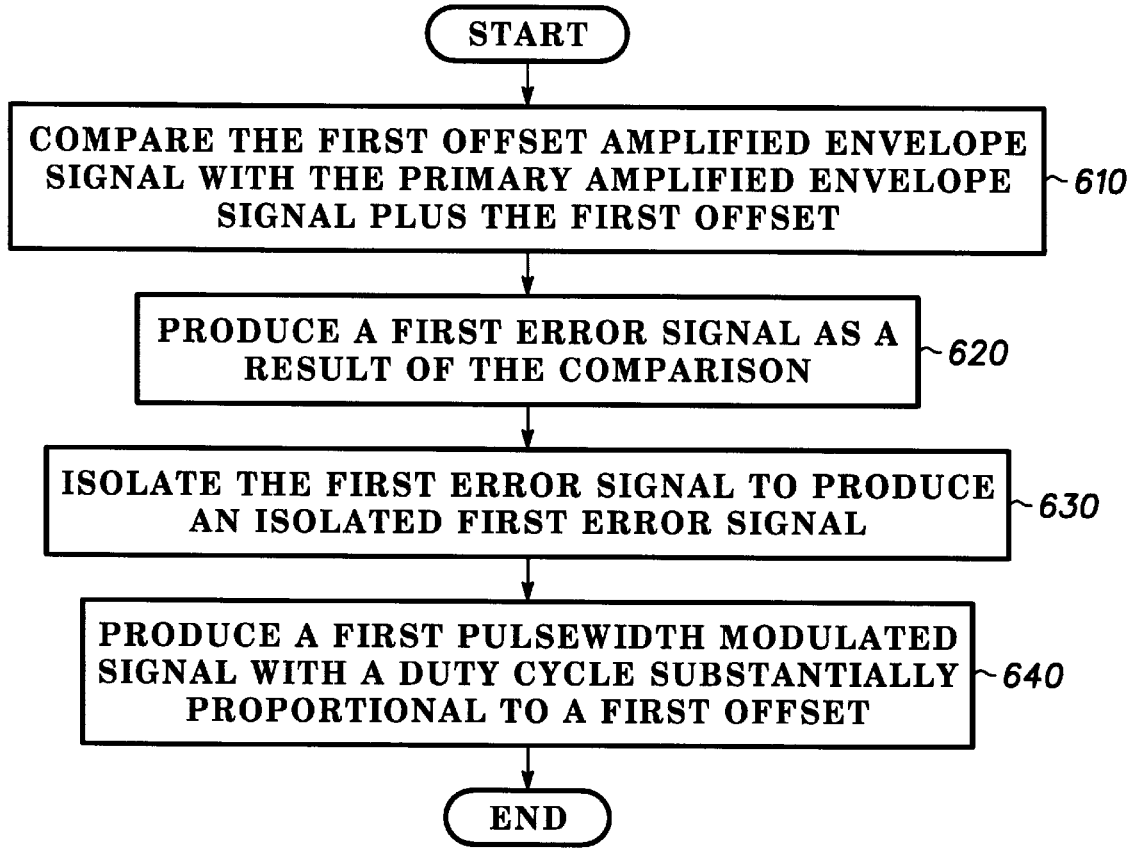
FIG. 7 shows a flow chart for a method of producing a pulsewidth modulated signal in accordance with a preferred embodiment of the present invention.

FIG. 7 shows a flow chart for a method of producing a pulsewidth modulated signal in accordance with a preferred embodiment of the present invention. Method 520 as shown in FIG. 7 corresponds to step 520 as shown in FIG. 5. In step 610 the first offset amplified envelope signal is compared with the primary amplified envelope signal plus an offset. This comparison step is the first step in a feedback loop that helps the desired offset output to be a high fidelity replica of the amplified envelope signal plus the desired offset.

In step 620 an error signal is generated as a result of the comparison in step 610. Then, in step 630, the error signal is isolated resulting in an isolated error signal. The isolation is advantageous because, in part, it allows the comparison step and the steps that follow to be referenced to a different potential. For example, if the comparison step is performed by an operational amplifier, the operational amplifier can be referenced directly to the primary amplified envelope signal and the components that perform the steps following can be referenced to a system ground potential. Of course, step 630 can be omitted if isolation between components is unnecessary.

In step 640 the first pulsewidth modulated signal is created with a duty cycle substantially proportional to the isolated first error signal. The duty cycle of this pulsewidth modulated signal will be substantially constant with variations due in part to the feedback comparison made in step 610.

In summary, the method and apparatus of the present invention as described represent a versatile way of achieving low phase distortion in a high efficiency, linear power amplifier. Highly efficient linear amplifiers with low phase distortion are very useful in the amplification of modulated signals which include information in both amplitude and phase. Communications devices, which often transmit signals having information in both amplitude and phase, benefit greatly from the apparatus and method of the present invention. Low distortion allows the communications devices to communicate more reliably, and high efficiency allows the devices to operate longer on a single battery.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments. For example, multiple driver amplifiers can be included, each having a modulating input. Then each modulating input can be driven by an additional offset amplified envelope output from the multi-output class S modulator.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of amplifying an input signal and creating a plurality of output signals, said method comprising the steps of:
   (a) producing a primary pulsewidth modulated signal with a duty cycle substantially proportional to said input signal;
   (b) filtering said primary pulsewidth modulated signal to produce a primary amplified signal;
   (c) producing a first pulsewidth modulated signal with a duty cycle substantially proportional to a first offset wherein step (c) comprises the steps of:
      (c1) comparing said first offset amplified signal with said primary amplified signal plus said first offset;
      (c2) producing a first error signal as a result of said comparing step;
      (c3) isolating said first error signal to produce a first electrically isolated error signal; and
      (c4) producing said first pulsewidth modulated signal with a duty cycle substantially proportional to said first electrically isolated error signal; and
   (d) filtering said first pulsewidth modulated signal and coupling said primary amplified signal therewith to produce a first offset amplified signal, wherein said plurality of output signals comprises said primary amplified signal and said first offset amplified signal.

2. The method of claim 1 wherein said isolating step comprises the step of optically coupling said first error signal and said first electrically isolated error signal.

3. The method of claim 1 wherein said isolating step comprises the step of magnetically coupling said first error signal and said first electrically isolated error signal.

4. A method of amplifying an input signal, said method comprising the steps of:
   (a) splitting said input signal into an envelope signal in an amplitude path and a carrier signal in a phase path;
   (b) producing a primary pulsewidth modulated signal with a duty cycle substantially proportional to said envelope signal;

(c) filtering said primary pulsewidth modulated signal to produce a primary amplified envelope signal;

(d) producing a first pulsewidth modulated signal with a duty cycle substantially proportional to a first offset wherein step (d) comprises the steps of:
  (d1) comparing said first offset amplified envelope signal with said primary amplified envelope signal plus said first offset;
  (d2) producing a first error signal as a result of said comparing step;
  (d3) isolating said first error signal to produce a first electrically isolated error signal; and
  (d4) producing said first pulsewidth modulated signal with a duty cycle substantially proportional to said first electrically isolated error signal;

(e) filtering said first pulsewidth modulated signal and coupling said primary amplified envelope signal therewith to produce a first offset amplified envelope signal;

(f) modulating a final amplifier stage in said phase path with said primary amplified envelope signal; and (g) modulating a driver amplifier stage in said phase path with said first offset amplified envelope signal from said amplitude path.

5. The method of claim 4 wherein said isolating step comprises the step of optically coupling said first error signal and said first electrically isolated error signal.

6. The method of claim 4 wherein said isolating step comprises the step of magnetically coupling said first error signal and said first electrically isolated error signal.

7. An apparatus for amplifying an input signal, said apparatus comprising:

an apparatus input port;

a plurality of apparatus output ports;

a primary pulsewidth modulator coupled to said apparatus input port;

a filter coupled between said primary pulsewidth modulator and one of said plurality of apparatus output ports; and at least one envelope tracking converter having a converter input port coupled to an output of said filter, wherein each of said at least one envelope tracking converter has a converter output port coupled to a different one of said plurality of apparatus output ports and wherein each of said at least one envelope tracking converter comprises:
  an error amplifier coupled between said converter input port and said converter output port;
  an isolating coupler coupled to an output of said error amplifier;
  a secondary pulsewidth modulator having an input coupled to an output of said isolating coupler, and having an output coupled to a power transformer; and
  a rectifier and filter coupled between an output of said power transformer and said converter output port.

8. The apparatus of claim 7 wherein said isolating coupler is an optical coupler.

9. The apparatus of claim 7 wherein said isolating coupler is a magnetic coupler.

10. A communications device comprising:
(a) an antenna for transmitting signals; and
(b) an apparatus for amplifying said signals prior to transmission by said antenna, said apparatus comprising:
  (b1) an apparatus input port;
  (b2) a plurality of apparatus output ports;
  (b3) a primary pulsewidth modulator coupled to said apparatus input port;
  (b4) a filter coupled between said primary pulsewidth modulator and one of said plurality of apparatus output ports; and
  (b5) at least one envelope tracking converter having a converter input port coupled to an output of said filter, wherein each of said at least one envelope tracking converter has a converter output port coupled to a different one of said plurality of apparatus output ports, wherein each of said at least one envelope tracking converter comprises:
    (b5a) an error amplifier coupled between said converter input port and said converter output port;
    (b5b) an isolating coupler coupled to an output of said error amplifier;
    (b5c) a secondary pulsewidth modulator having an input coupled to an output of said isolating coupler, and having an output coupled to a power transformer; and
    (b5d) a rectifier and filter coupled between an output of said power transformer and said converter output port.

11. The communications device of claim 10 wherein said isolating coupler is an optical coupler.

12. The communications device of claim 10 wherein said isolating coupler is a magnetic coupler.

13. A method of amplifying an input signal and creating a plurality of output signals, said method comprising the steps of:
(a) producing a primary pulsewidth modulated signal with a duty cycle substantially proportional to said input signal;
(b) filtering said primary pulsewidth modulated signal to produce a primary amplified signal;
(c) producing a first pulsewidth modulated signal with a duty cycle substantially proportional to a first offset wherein step (c) comprises the steps of:
  (c1) comparing said first offset amplified signal with said primary amplified signal plus said first offset;
  (c2) producing a first error signal as a result of said comparing step; and
  (c3) producing said first pulsewidth modulated signal with a duty cycle substantially proportional to said first error signal; and
(d) filtering said first pulsewidth modulated signal and coupling said primary amplified signal therewith to produce a first offset amplified signal, wherein said plurality of output signals comprises said primary amplified signal and said first offset amplified signal.

14. A method of amplifying an input signal and creating a plurality of output signals, said method comprising the steps of:
(a) producing a primary pulsewidth modulated signal with a duty cycle substantially proportional to said input signal;
(b) filtering said primary pulsewidth modulated signal to produce a primary amplified signal;
(c) producing a first pulsewidth modulated signal with a duty cycle substantially proportional to a first offset; and
(d) filtering said first pulsewidth modulated signal and coupling said primary amplified signal therewith to produce a first offset amplified signal, wherein said plurality of output signals comprises said primary amplified signal and said first offset amplified signal;

(e) producing at least one additional pulsewidth modulated signal, wherein each of said at least one additional pulsewidth modulated signal has a duty cycle substantially proportional to an additional offset; and (f) filtering said at least one additional pulsewidth modulated signal and coupling said primary amplified signal therewith to produce at least one additional offset amplified signal, wherein said plurality of output signals further comprises said at least one additional offset amplified signal.

15. A power amplifier comprising:

(a) a driver amplifier stage having an input coupled to an input of said power amplifier, said driver amplifier stage having a modulating input;

(b) a power amplifier stage having an input coupled to an output of said driver amplifier stage and having an output coupled to an output of said power amplifier, said power amplifier stage having a modulating input; and (c) a multi-output class S modulator having an input coupled to an input of said power amplifier, and having at least two outputs, wherein a first output of said multi-output class S modulator produces an amplified envelope signal and is coupled to said modulating input of said power amplifier stage, and a second output of said multi-output class S modulator produces an offset amplified envelope signal and is coupled to said modulating input of said driver amplifier stage, wherein said multi-output class S modulator comprises:

(c1) a primary pulsewidth modulator coupled to said input of said multi-output class S modulator;

(c2) a filter coupled between said primary pulsewidth modulator and one of said at least two outputs; and (c3) at least one envelope tracking converter having a converter input port coupled to an output of said filter, wherein each of said at least one envelope tracking converter has a converter output port coupled to a different one of said at least two outputs, wherein each of said at least one envelope tracking converter comprises:

(c3a) an error amplifier coupled between said converter input port and said converter output port;

(c3b) an isolating coupler coupled to an output of said error amplifier;

(c3c) a secondary pulsewidth modulator having an input coupled to an output of said isolating coupler, and having an output coupled to a power transformer; and (c3d) a rectifier and filter coupled between an output of said power transformer and said converter output port.

* * * * *